United States Patent [19]

Barr

[11] Patent Number: 5,364,737
[45] Date of Patent: Nov. 15, 1994

[54] WATERBONE PHOTORESISTS HAVING ASSOCIATE THICKENERS

[75] Inventor: Robert K. Barr, Laguna Niguel, Calif.

[73] Assignee: Morton International, Inc., Chicago, Ill.

[21] Appl. No.: 199,037

[22] Filed: Feb. 18, 1994

Related U.S. Application Data

[63] Continuation-in-part of Ser. No. 186,875, Jan. 25, 1994, abandoned.

[51] Int. Cl.⁵ ............................................. G03C 1/73
[52] U.S. Cl. .................... 430/281; 430/906; 430/910; 522/85; 522/110
[58] Field of Search ............ 430/281, 906, 910; 522/85, 110

[56] References Cited

U.S. PATENT DOCUMENTS

| | | | |
|---|---|---|---|
| 3,912,516 | 10/1975 | Recchia et al. | 430/906 |
| 3,929,743 | 12/1975 | Sramek | 260/80.8 |
| 4,079,028 | 3/1978 | Emmons et al. | 260/29.6 |
| 4,426,485 | 1/1984 | Hoy et al. | 524/591 |
| 4,743,698 | 5/1988 | Ruffner et al. | 549/478 |
| 4,952,481 | 8/1990 | Seio et al. | 430/284 |
| 5,045,435 | 9/1991 | Adams et al. | 430/288 |

FOREIGN PATENT DOCUMENTS 0362769 4/1990 European Pat. Off.

*Primary Examiner*—Jack P. Brammer
*Attorney, Agent, or Firm*—Wayne E. Nacker; Gerald K. White

[57] ABSTRACT

A waterborne photoimageable composition or photoresist comprises a latex binder polymer having sufficient carboxylic acid functionality to render it developable in alkaline aqueous solution, a photopolymerizeable monomer fraction, a photoinitiator and a polyether polyurethane associate thickener which supports an emulsion of the monomer fraction in aqueous medium. The carboxylic acid functionality of the latex binder polymer is neutralized at from 0 to about 20%.

6 Claims, No Drawings

WATERBONE PHOTORESISTS HAVING ASSOCIATE THICKENERS

This is a continuation-in-part of copending application Ser. No. 08/186,875 filed on Jan. 25, 1994, now abandoned.

The present invention is directed to photoresists, such as those used for forming printed circuit boards and more particularly to waterborne, liquid applied, contact imageable photoresists.

BACKGROUND OF THE INVENTION

Photoimageable compositions useful as resists for forming printed circuits, printing plate, solder masks or the like have been used for some time now. The earliest photoresists were solvent-borne and solvent-developable. The development of aqueous-developable resists represented an advance in reducing solvent emissions in the immediate workplace and general environment. The continued emphasis in reducing organic solvent both from the workplace and from the general environment has spurred the search for waterborne photoresists which are formulated and applied as aqueous liquids.

U.S. Pat. No. 5,045,435, the teachings of which are incorporated herein by reference, describes a waterborne photoresist composition which is developable in alkaline aqueous solution. The composition comprises a multifunctional monomer, a photoinitiator and a latex of water-insoluble carboxylated acrylic copolymer. To stabilize the composition and to adjust the viscosity, this patent teaches neutralizing the latex polymer to at least 25% with a base, such as ammonia, another amine, or sodium hydroxide.

The high degree of neutralization required in the composition in U.S. Pat. No. 5,045,435 has several disadvantages. The neutralizer, e.g., amine, reacts with the acid functional polymer, producing water soluble salts. Because all of the neutralizer is not removed during drying, the remaining salts become sites for potentially damaging chemical attack. It is therefore desirable to reduce the amount of neutralizers to improve chemical resistance. Amines or ammonia, when used as the neutralizer, have associated odors, amines having a characteristic "fishy" odor. Primary amine neutralizers and ammonia are highly reactive, resulting in viscosity drift in the lacquer prior to coating, the viscosity drifting as much as 3000 cps over one week.

In teaching and demonstrating the need for substantial neutralization in its compositions, U.S. Pat. No. 5,045,435 also teaches that obtaining the critical rheology cannot be obtained with the addition of thickening agents.

It is a general object of the present invention to provide a waterborne photoimageable composition requiring a substantially reduced amount of neutralization of the latex polymer.

SUMMARY OF THE INVENTION

In accordance with the invention, a waterborne photoimageable composition comprises an aqueous composition containing A) between about 30 and about 80 wt % of a latex binder polymer having acid functionality, e.g., carboxylic acid functionality or sulfonic acid functionality, which provides an acid number of between about 50 and about 250, B) between about 20 and about 50 wt % of a fraction of alpha,beta-ethylenically unsaturated monomers, C) between about 0.1, preferably at least about 1, and about 25 wt % of a photoinitiator or photoinitiator chemical system which generates free radicals, and D) between about 1, preferably at least 2, and about 40 wt % of a polyether polyurethane associate thickener, the weight percentages being based on total weight of components A-D. The acid content of the latex binder polymer is either not neutralized with base or is neutralized up to about 20% of its carboxylic functionality.

DETAILED DESCRIPTION OF CERTAIN PREFERRED EMBODIMENTS

Latex binder polymers useful in the photoimageable composition of the present invention are typically prepared by emulsion polymerization of alpha, beta-unsaturated monomers, such as vinyl, acrylate or styrene monomers. Sufficient acid functional monomers are used to provide the acid number of between about 50 and about 250, preferably at least about 100. A typical emulsion polymerization procedure and some examples of suitable emulsions are found in U.S. Pat. No. 3,929,743, the teachings of which are incorporated herein by reference. Suitable emulsions can also be obtained commercially, e.g., Neocryl® CL-340 (40% solids) available from ICI Resins U.S. and Acrysol® I-2074 (46% solids) available from Rohm and Haas.

Suitable acid functional monomers for use in forming the acid functional binder polymer have the formulae:

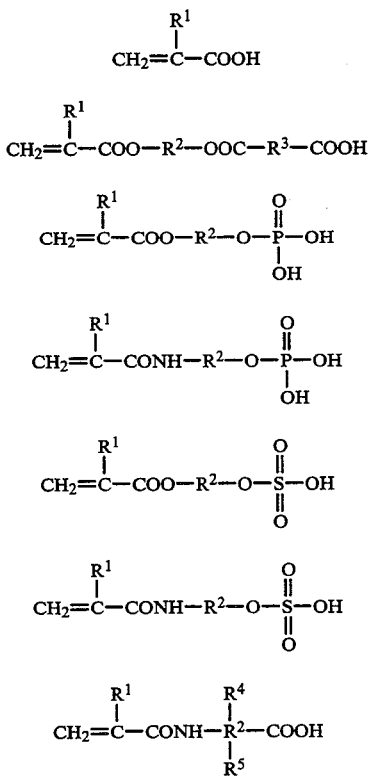

wherein $R_1$ represents a hydrogen atom or a methyl group, $R_2$ represents $(CH_2)_n$ wherein n is an integer of 1 to 6, $R_3$ represents an alkylene group having 1 to 6 carbon atoms or a phenylene group, and $R_4$ and $R_5$ are either $R_1$ or OH, provided $R_4$ and $R_5$ are not both OH.

Some specific examples of suitable acid functional monomers are acrylic acid, methacrylic acid, maleic acid, fumaric acid, citraconic acid, 2-acrylamido-2- methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

So that the photoimageable composition is contact imageable, i.e., drys to a tack-free state, the glass transition temperature ($T_g$) of the latex binder polymer is preferably at least about 60° C. as measured by Differential Scanning Calorimetry (DSC)@20° min. The polymers have a weight average molecular weight (Mw) of between about 500 and about 200,000 as measured by gel permeation chromatography (GPS) using a polystyrene standard.

To produce the image, this negative-acting photoimageable composition contains photopolymerizeable monomers, particularly alpha,beta-ethylenically unsaturated monomers, including a substantial portion of multi-functional monomers. Useful monomers include those, listed above, used to form the binder polymers. Particularly suitable monomers include multifunctional acrylic monomers, such as tetraethylene glycol diacrylate (TEGDA), trimethylol propane triacrylate (TMPTA), butanediol dimethacrylate (BDDMA) and pentaerythritol triacrylate (PETA). The monomer fraction may include both water-soluble and water-insoluble monomers; however, the monomer fraction should contain a sufficiently high proportion of water-insoluble (having solubilities in water at 20° C. below about 0.3 g/100 ml) monomers, e.g., above about 20 mole percent, so that the monomer fraction, as a whole, is insoluble in water.

To initiate polymerization of the monomers upon exposure to actinic radiation, the photoimageable composition contains an appropriate photoinitiator(s) or photoinitiator chemical system. Suitable photoinitiators include benzoin ethers, benzil ketals, acetophenones, benzophenones and related compounds with amines. Preferred initiators are thioxanthones, e.g., 2-isopropyl thioxanthones, particularly in conjunction with an amine.

In accordance with the invention, viscosity adjustment and stabilization of the aqueous photoimageable composition are achieved using a polyether polyurethane associate thickener. Polyether polyurethane thickeners are polymers having at least two hydrophobic segments which are the residues of hydrophobic isocyanates, generally isocyanates having isocyanate functionality of 2 or higher, and at least one hydrophilic polyether segment joining the hydrophobic segments by urethane linkages. The block polymers which act as associate thickener may take a variety of forms including ABA, (AB)$_n$, star polymers and the like. The polyether segments are formed from poly(alkylene oxide) segments, formed from monomers such as propylene oxide and ethylene oxide. To be sufficiently hydrophilic, generally it is necessary that at least about 3 mole percent of the poly(alkylene oxide) segment(s) be ethylene oxide residues. The hydrophobic portion of the isocyanate residue is typically an alkyl, cycloalkyl or aromatic moiety. Polyether polyurethane associate thickeners and their function are described, for example by A. J. M. Knoef, and H. Slingerland, "Urethane-Based Polymeric Thickeners for Aqueous Coating Systems" *JOCCA*, Sept. 1992, pp 335–338; J. H. Bieleman et al. *Polymers Paint Colour Journal* 1986, V.176(4169) pp. 450–460; and A. J. Whitton and R. E. Van Doren *Polymers Paint Colour Journal* 1991, V.181(4286) pp. 374–377. Particularly suitable polyether polyurethane associate thickeners and their synthesis are described in U.S. Pat. No. 4,079,028 to Emmons et al., the teachings of which are incorporated herein by reference. Suitable polyether polyurethane associate thickeners are also described in U.S. Pat. No. 4,426,485 to Hoy et al. and U.S. Pat. No. 4,743,698 to Ruffner et al., the teaching of each of which are incorporated herein by reference. Examples of suitable commercially available associate thickeners are DSX1514 (Henkel) and QR708 (Rohm and Haas).

In addition to thickening the composition, the associate thickener acts as a surfactant, emulsifying the monomer fraction. The associate thickener also helps stabilize the latex emulsion of binder polymer.

By using the polyether polyurethane associate thickener, less neutralization of the binder polymer latex is required. In some cases no neutralization is required. In other cases, it is desirable to neutralize the binder up to about 20% of the equivalent acid functionality of the binder polymer. Typically base will be added to neutralize at least about 2% of the acid functionality of the binder polymer. Neutralization may be done with ammonia; primary, secondary, or tertiary amines; or hydroxides. Preferred neutralizing bases are hydroxy functional tertiary amines. The addition of associate thickener in place of at lease some of the neutralizer allows for a smoother more uniform coating. The improved coating quality minimizes potential circuit board defects caused by thin spots or pin holes in the coating. In addition, when applied by roller coating, the photoimageable composition with associate thickener produces a smoother coating at lower roller compression. Low roller compression results in extended life of the rubber rollers.

Reducing neutralizers improves chemical resistance of the applied and dried photoimageable composition layer. When ammonia or amine use is reduced, odor is reduced. Associate thickeners reduce viscosity drift of the aqueous photoimageable composition. Even under high shear, viscosity tends to remain stable.

In addition to components A-D listed above, minor amounts (generally less than about 10 wt % total based on the weight of A-D) of conventional additives may be used, including; antifoam agents, antioxidants, dyes, adhesion promoters, slip aids, surface tension modifiers, and additional surfactants. Surfactants, if used, are preferably anionic or non-ionic. Up to about 5 wt. % of a high boiling solvent, such as propylene glycol monomethyl ether may be added as a coalescing agent.

A particularly desirable surfactant which combines excellent wetting characteristics without foaming is a non-ionic fluoroaliphatic oxyethylene adduct having the general formula:

$CF_3-(CF_2)_n-Y-X_m-Z$ where $n=0$ to 20, $Y=-SO_2-N(C_1-C_{10}alkyl)$, $X=CH_2-CH_2-O$ or $CH(CH_3)-CH_2-O$, $m=0$ to 20, and $Z=CH_2-CH_2-OH$ or $CH(CH_3)-CH_2-OH$.

An example of such a surfactant is sold under the trademark Fluorad FC170-C by 3M. Surfactants are typically used at levels of between about 0.5 and about 3.0 wt. % of photoimageable composition solids.

In a preferred method of preparing the waterborne photoimageable composition of the present invention, those components, such as initiators, antioxidants and dyes, most compatible with a hydrophobic phase are admixed with the monomer fraction to produce a monomer base and those components most compatible with an aqueous phase with the latex polymer, such as antifoam, neutralizer and associate thickener, are admixed to form a polymer mix. The hydrophobic phase and polymer mix are blended to form an hydrophobic phase-in-water emulsion. Subsequently, high boiling solvents, surfactants, including slip aids, surface tension modifiers, and adhesion promoters are added.

The final water-borne composition is generally between about 20 and about 40 wt. percent solids. In the waterborne composition, the binder comprises between about 10 and about 30 wt %, monomers from about 3 to 20 wt %, initiator from about 0.3 to about 10 wt % and thickener from about 1.5 to about 20 wt %.

The composition may be coated by any of the coating systems known in the art for coating solvent-borne photoimageable compositions, such as roll coating, dip coating, spray coating or curtain coating.

The compositions of the present invention are applied in a conventional manner, either as liquid compositions directly to a metal clad blank laminate or to a polymeric support sheet to form a dry film. After coating, the composition is dried to remove water and also to remove volatiles, such as ammonia or amine, water, etc., thereby rendering the solution polymer insoluble in acidic or neutral aqueous medium. As the photoimageable composition dries, the system coalesces into a continuous film. Drying is preferably carried out at somewhat elevated temperatures, both to hasten removal of the water, and to drive off the ammonia or volatile amine. Preferably, drying is carried out at a temperature of about 90° C.

In forming a dry film, a water-borne composition is applied to flexible support sheet, e.g., polyethylene terephthalate, and then dried to remove water and volatiles. Subsequently, a protective sheet, e.g., polyethylene, is applied to the photoimageable composition layer, and the dry film is rolled into reels. In drying the photoimageable composition layer, it is found desirable in some cases to leave a residual water content of between about 1 and about 2 wt. % (relative to solids of the photoimageable composition layer). This residual water acts to allow the photoimageable composition layer to conform to surface defects of a substrate, e.g., a copper-clad board, when laminated thereto.

Processing is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

Not only can waterborne primary imaging photoresists be provided in accordance with the invention, but solder mask-forming compositions can be provided as well. By solder mask is meant herein a hard, permanent layer which meets at least the minimal requirements of the abrasion resistance tests as defined in IPC-SM-840B, Table 12, Summary of Criteria for Qualification/Conformance (Institute for Interconnecting Circuits). To become hard and permanent, it is generally necessary that the photoimageable composition be curable after exposure, development and processing of the board, e.g., by thermal and/or UV curing. One way to provide a post-cure is to provide binder polymer having free —OH groups in the backbone that may be cured, for example, by cross-linking with aminoplast resins, such as melamine/formaldehyde resins and urea/formaldehyde resins. Alternatively, the photoimageable composition may contain a compatible epoxy resin and a curative for the epoxy resin. It is found that waterborne photoimageable compositions in accordance with the invention exhibit excellent shelf lives after application to copper substrates and can remain on a copper-clad board upwards of several days.

The invention will now be described in greater detail by way of specific examples.

EXAMPLES 1-9

Water-borne photoimageable compositions were formulated according to Table 1 below. Amounts are in grams. 2.3 grams of neutralizer represents about 15 % neutralization; 4.5 grams of neutralizer represents about 30% neutralization. Accordingly, Examples 3-6 are examples in accordance with the present invention; Examples 1-2 and 7-9 are comparative examples. Performance data is according to table 2 below; "n.a. is recorded when bad performance prohibited further processing conditions. "Monomer base" in Table 1 is per table 3; all materials being mixed together, filtered and subsequently added to the aqueous portion.

TABLE #1

| FORMULATION NAME | INGREDIENT TYPE | #1 | #2 | #3 | #4 | #5 | #6 | #7 | #8 | #9 |
|---|---|---|---|---|---|---|---|---|---|---|
| Neocryl CL-340 (40% solids) | polymer | 100.0 | 100.0 | 100.0 | 100.0 | 100.0 | 100.0 | 100.0 | 100.0 | 100.0 |

TABLE #1-continued

| FORMULATION NAME | INGREDIENT TYPE | #1 | #2 | #3 | #4 | #5 | #6 | #7 | #8 | #9 |
|---|---|---|---|---|---|---|---|---|---|---|
| DMAMP-80 (Angus) | tertiary amine neutralizer | 4.5 | 0.0 | 0.0 | 0.0 | 2.3 | 0.0 | 0.0 | 2.3 | 0.0 |
| AMP-95 (Angus) | primary amine neutralizer | 0.0 | 4.5 | 0.0 | 0.0 | 0.0 | 2.3 | 0.0 | 0.0 | 2.3 |
| DSX-1514 (Henkel) | associative thickener | 0.0 | 0.0 | 4.5 | 9.0 | 2.3 | 2.3 | 0.0 | 0.0 | 0.0 |
| Deionized Water | primary solvent | 100.0 | 100.0 | 100.0 | 100.0 | 100.0 | 100.0 | 100.0 | 100.0 | 100.0 |
| BYK-033 (BYK/Chemie) | antifoam | 1.0 | 1.0 | 1.0 | 1.0 | 1.0 | 1.0 | 1.0 | 1.0 | 1.0 |
| Monomer Base | see Table #3 | 20.5 | 20.5 | 20.5 | 20.5 | 20.5 | 20.5 | 20.5 | 20.5 | 20.5 |
| Q4-3667 (Dow Corning) | slip aid | 0.45 | 0.45 | 0.45 | 0.45 | 0.45 | 0.45 | 0.45 | 0.45 | 0.45 |
| Fluorad FC170-C (3M) | surface tension modifier | 1.0 | 1.0 | 1.0 | 1.0 | 1.0 | 1.0 | 1.0 | 1.0 | 1.0 |
| Texanol (Eastman) | coalescing solvent | 4.5 | 4.5 | 4.5 | 4.5 | 4.5 | 4.5 | 4.5 | 4.5 | 4.5 |

Neocryl CL-340 is a styrene/acrylic polymer having an acid number of about 160.
Q4-3667 (Dow) is an 80:20 mixture of polyether modifier dimethylsiloxanes and cyclodimethylsiloxanes.

TABLE #2

| FORMULATION NAME | #1 | #2 | #3 | #4 | #5 | #6 | #7 | #8 | #9 |
|---|---|---|---|---|---|---|---|---|---|
| DMAMP-80 | 4.5 | 0.0 | 0.0 | 0.0 | 2.3 | 0.0 | 0.0 | 2.3 | 0.0 |
| AMP-95 (Angus) | 0.0 | 4.5 | 0.0 | 0.0 | 0.0 | 2.3 | 0.0 | 0.0 | 2.3 |
| DSX-1514 (Henkel) | 0.0 | 0.0 | 4.5 | 9.0 | 2.3 | 2.3 | 0.0 | 0.0 | 0.0 |
| PERFORMANCE RESULTS | | | | | | | | | |
| Viscosity (initial) | 2300 cps | 2800 cps | 3500 cps | 5000 cps | 2900 cps | 3200 cps | 0 cps | 0 cps | 0 cps |
| Viscosity (1 week holding) | 1900 cps | 800 cps | 3500 cps | 5000 cps | 2700 cps | 2700 cps | 0 cps | 0 cps | 0 cps |
| Odor | strong fishy | moderate ammonia | none | none | slight fishy | slight ammonia | none | slight fishy | none |
| Emulsion Stability | fair | fair to good | good | very good | fair to good | good | poor | poor | poor to fair |
| Substrate Staining | moderate stain | moderate stain | no stain | no stain | slight stain | slight stain | n.a. | n.a. | n.a. |
| Alkaline Resistance | poor | poor | good | good | fair to good | fair to good | n.a. | n.a. | n.a. |
| Coating Defects | 10 voids/ft2 | 5 voids/ft2 | 0 voids/ft2 | 0 voids/ft2 | 2 voids/ft2 | 2 voids/ft2 | n.a. | n.a. | n.a. |
| Coating Uniformity | severe ribbing | moderate ribbing | slight ribbing | no ribbing | moderate ribbing | slight ribbing | n.a. | n.a. | n.a. |
| Developing Time | 25 sec. | 27 sec. | 29 sec. | 29 sec. | 27 sec. | 28 sec. | n.a. | n.a. | n.a. |
| Photospeed (at 100 mj/cm$^2$) | Copper 6 | Copper 7 | Copper 8 | Copper 8 | Copper 7 | Copper 7 | n.a. | n.a. | n.a. |
| Circuit Pattern Defects | 5 defects/ft2 | 5 defects/ft2 | 1 defect/ft2 | 0 defects/ft2 | 3 defects/ft2 | 4 defects/ft2 | n.a. | n.a. | n.a. |

DMAMP = 2-dimethylamino-2-methyl-1-propanol; AMP = 2-amino-2-methyl-1-propanol.

TABLE #3

| MONOMER BASE COMPONENTS | COMPONENT TYPE | GRAMS PER FORMULA |
|---|---|---|
| Ethoxylated TMPA (3 moles ethoxylation) | multi Functional acrylate | 17.6 |
| Modaflow | flow additive | 0.05 |
| Antioxidant 2246 | antioxidant | 0.03 |
| Quantacure ITX (thioxanthone) | photosensitizer | 0.59 |
| Quantacure EPD (3° amine) | photoinitiator | 1.49 |
| Baso Blue 688 | background dye | 0.09 |
| Triphenyphosphine | antioxidant | 0.5 |
| Benzotriazole | adhesion promoter | 0.25 |

TMPA = trimethylol propane triacrylate

What is claimed is:

1. A photoimageable composition that can be borne in water comprising
   A) between about 30 and about 80 wt % of a latex binder polymer having carboxylic acid functionality which provides an acid number of between about 50 and about 250;
   B) between about 20 and about 50 wt % of a fraction of alpha,beta-ethylenically unsaturated monomers;
   C) between about 0.1 and about 25 wt % of a photoinitiator or photoinitiator chemical system which generates free radicals; and
   D) between about 1 and about 40 wt % of a polyether polyurethane associate thickener, said weight percentages being based on total weight of components A-D,
   the carboxylic acid content of the latex binder polymer being either not neutralized with base or neutralized with base up to about 20% of its carboxylic functionality.

2. The photoimageable composition of claim 1 dispersed in an aqueous medium.

3. A dry film comprising a polymeric support sheet and a layer of the photoimageable composition of claim 1 thereon.

4. The photoimageable composition of claim 1 containing at least about 2 wt. % of said associate thickner based on total weight of components A-D.

5. The photoimageable composition of claim 1 having at least about 1 wt. % of said photoinitiator chemical system.

6. The photoimageable composition of claim 1 containing at least about 2 wt. % of said photoinitiator or photoinitiator chemical system based upon total weight of components A-D.

* * * * *